(12) United States Patent
Fenner

(10) Patent No.: US 6,498,107 B1
(45) Date of Patent: Dec. 24, 2002

(54) INTERFACE CONTROL FOR FILM DEPOSITION BY GAS-CLUSTER ION-BEAM PROCESSING

(75) Inventor: David B. Fenner, Westford, MA (US)

(73) Assignee: Epion Corporation, Billerica, MA (US)

( * ) Notice: Subject to any disclaimer, the term of this patent is extended or adjusted under 35 U.S.C. 154(b) by 0 days.

(21) Appl. No.: 09/563,035

(22) Filed: May 1, 2000

(51) Int. Cl.$^7$ ............................................. H01L 21/302
(52) U.S. Cl. ...................... 438/706; 438/712; 438/745
(58) Field of Search ................................ 438/745, 712, 438/706

(56) References Cited

U.S. PATENT DOCUMENTS

| | | | |
|---|---|---|---|
| 4,522,886 A | 6/1985 | Chin et al. | 428/446 |
| 4,579,609 A | 4/1986 | Reif et al. | |
| 4,740,267 A | 4/1988 | Knauer et al. | 156/635 |
| 4,799,454 A | 1/1989 | Ito | 118/723 |
| 5,110,438 A | * 5/1992 | Ohmi et al. | 204/298.34 |
| 5,173,474 A | 12/1992 | Connell et al. | 505/1 |
| 5,284,544 A | * 2/1994 | Mizutani et al. | 156/345 |
| 5,358,925 A | 10/1994 | Connell et al. | 505/235 |
| 5,459,326 A | 10/1995 | Yamada | 250/398 |
| 5,561,326 A | 10/1996 | Ito et al. | 257/751 |
| 5,770,263 A | 6/1998 | Hawthorne et al. | |
| 5,811,022 A | * 9/1998 | Savas et al. | 216/68 |
| 5,814,194 A | 9/1998 | Deguchi et al. | 204/192.1 |
| 5,888,414 A | * 3/1999 | Collins et al. | 216/68 |

FOREIGN PATENT DOCUMENTS

| | | |
|---|---|---|
| JP | 06275545 JP A | 9/1994 |
| JP | 08127867 JP A | 5/1996 |
| JP | 09041122 JP A | 2/1997 |
| WO | WO 88/02790 | 4/1988 |
| WO | WO 00/26431 | 5/2000 |

OTHER PUBLICATIONS

P. Burggraaf, "Keeping the 'RCA' in wet chemistry cleaning", Semiconductor International, Jun. 1994, pp. 86–90.

I. Yamada and J. Matsuo, "Cluster ion beam processing", Matl. Science in Semiconductor Processing I, (1998) pp. 27–41.

J. Matsuo, et al., "Cluster ion assisted thin film formation", Proceedings of the 14th Intl. Conf. on Application of Accelerators in Research and Industry. Denton, TX USA Nov. 6–9, 1996, AIP CP392, (1997) pp. 499–502.

D.B. Fenner, D.K. Biegelsen, R.D. Bringans, and B.S. Krusor, "Silicon Surface Passivation For Heteroepitaxy by Hydrogen Termination", Materials Research Society Symp. Proc., edited by M. Kawabe, T.D. Sands, E.R. Weber, and R.S. Williams, vol. 148, pp. 279–284 (1989).

D.B. Fenner, D.K. Biegelsen, and R.D. Bringans, "Silicon Surface Passivation by Hydrogen Termination: A Comparative Study of Preparation Methods", Journal of Applied Physics, vol. 66(1), pp. 419–424, (Jul. 1989).

(List continued on next page.)

Primary Examiner—Robert Kunemund
Assistant Examiner—Vanessa Perez-Ramos
(74) Attorney, Agent, or Firm—Perkins, Smith & Cohen, LLP; Jerrt Cohen

(57) ABSTRACT

Methods are disclosed for gas-cluster ion-beam deposition of thin films on silicon wafers rendered free of native oxides by termination of the surface bonds and subsequent reactive deposition. Hydrogen termination of the surface of silicon renders it inert to reoxidation from oxygen-containing environmental gasses, even those found as residue in vacuum systems, such as those used to deposit films. Nitrogen termination improves the interface with overlying metal-oxide thin films. The film is formed in intimate contact with the silicon crystal surface forming a nearly ideal interface.

31 Claims, 6 Drawing Sheets

OTHER PUBLICATIONS

E.M. Ajimine, F.E. Pagaduan, M.M. Rahman, C.Y. Yang, H. Inokawa, D.K. Fork and T.H. Geballe, "Electrical Characterization of Metal–Insulator–Semiconductor Diodes Fabricated from Laser–Ablated $YBa_2Cu_3O_{7-\delta}$/Yttria–Stabilized Zirconia Films on Si Substrates", Applied Physics Letters, vol. 59(22), pp. 2889–2891 (Nov. 1991).

J. Qiao, E.M. Ajimine, P.P. Patel, G.L. Giese, C.Y. Yang and D.K. Fork, "Thermally Activated Reversible Threshold Shifts in $YBa_2Cu_3O_{7-\delta}$/Yttria–Stabilized Zirconia/Si Capacitors", Applied Physics Letters, vol. 61(26), pp. 3184–3186 (Dec. 1992).

J. Qiao, K. Wang and C.Y. Yang, "Determination of the Density of Trap States at $Y_2O_3$–Stabilized $ZrO_2$/Si Interface of $YBa_2Cu_3O_{7\delta}$/$Y_2O_3$–Stabilized $ZrO_2$/Si Capacitors", Applied Physics Letters, vol. 64(13), pp. 1732–1734 (Mar. 1994).

H. Ono and K.–I. Koyanagi, "Formation of Silicon–Oxide Layers at the Interface Between Tantalum Oxide and Silicon Substrate", Applied Physics Letters, vol. 75(22), pp. 3521–3523 (Nov. 1999).

H.F. Luan, S.J. Lee, C.H. Lee, S.C. Song, Y.L. Mao, Y. Senzaki, D. Roberts, and D.L. Kwong, "High Quality $Ta_2O_5$ Gate Dielectrics with $T_{ox,eq} < 10$ Å", IEDM Technical Digest, pp. 141–144 (IEEE, Dec. 1999).

H. Yang and G. Lucovsky, "Integration of Ultrathin (1.6~2.0 nm) RPECVD Onxynitride Gate Dielectrics into Dual Poly–Si Gate Submicron CMOSFETs" IEDM Technical Digest, pp. 245–248 (IEEE, Dec. 1999).

I. Kondo, T. Yoneyama, K. Kondo, O. Takenaka and A. Kinbara, "Effects of Different Pretreatments on the Surface Structure of Silicon and the Adhesion of Metal Films", Journal of Vacuum Science and Technology, vol. A10(5), p. 3166–3170 (Sep./Oct. 1992).

I. Kondo, T. Yoneyama, K. Kondo, O. Takenaka and A. Kinbara, "Interface Structure and Adhesion of Sputtered Metal Films on Silicon: The Influence of Si Surface Condition", Journal of Vacuum Science and Technology, vol. A11(2), p. 319–324 (Mar./Apr. 1993).

B.G. Demczyk, R. Naik, G. Auner, C. Kota, and U. Rao, "Growth of Cu Films on Hydrogen Terminated Si(100) and Si(111) Surfaces", Journal of Applied Physics, vol. 75(4), p. 1956–1961 (Feb. 1994).

E.T. Krastev, L.D. Voice, and R.G. Tobin, "Surface Morphology and Electric Conductivity of Epitaxial Cu(100) Films Grown on H–Terminated Si(100)", Journal of Applied Physics, vol. 79(9), p. 6865–6871 (May 1996).

H. Gong, M. Rao, D.E. Laughlin, and D.N. Lambeth, "Highly Oriented NiFe Soft Magnetic Films on Si Substrates", Journal of Applied Physics, vol. 85(8), p. 5750–5752 (Apr. 1999).

D.B. Fenner, D.K. Fork, J.B. Boyce, G.A.N. Connell, and A.M. Viano, "Deposition and Characterization of Y–Ba–Cu–O Thin Films on Silicon Substrates: Interface Analysis", Physica C—Superconductivity, edited by N.E. Phillips, R.N. Shelton, and W.A. Harrison (North–Holland), vol. 162–164, pp. 141–142 (1989).

J.B. Boyce, G.A.N. Connell, D.K. Fork, D.B. Fenner, K. Char, F.A. Ponce, F. Bridges, J.C. Tramontana, A.M. Viano, S.S. Laderman, R.C. Taber, S. Tahara, and T.H. Geballe, "In–Situ Growth of Superconducting $YBa_2Cu_3O_y$ Films By Pulsed Laser Deposition", Society of Photo–Optical Instrumentation Engineers (SPIE) Symposium Proceedings Processing of Films for High Tc Superconducting Electronics, edited by T. Venkatesan, vol. 1187, pp. 136–147 (Oct. 1989).

D.K. Fork, D.B. Fenner, G.A.N. Connell, J.M. Phillips, and T.H. Geballe, "Epitaxial Yttria–Stabilized Zirconia on Hydrogen–Terminated Si by Pulsed Laser Deposition", Applied Physics Letters, vol. 57(11), pp. 1137–1139 (Sep. 1990).

D.K. Fork, D.B. Fenner, and T.H. Geballe, "Growth of Epitaxial $PrO_2$ Thin Films on Hydrogen Terminated Si(111) by Pulsed Laser Deposition", Journal Applied Physics, vol. 68(8), pp. 4316–4318 (Oct. 1990).

D.B. Fenner, A.M. Viano, G.A.N. Connell, J.B. Boyce, D.K. Fork, F.A. Ponce, and J.C. Tramontana, "XPS Analysis of Y–Ba–Cu–O and Zr–O Thin Films and Interfaces with Silicon Substrates", Materials Research Society Symp. Proc., edited by D. Christen, J. Narayan, and L. Schneemeyer, vol. 169, pp. 1005–1008 (1990).

D.K. Fork, D.B. Fenner, A. Barrera, J.M. Phillips, T.H. Geballe, G.A.N. Connell, and J.B. Boyce, "Buffer Lay ers For High–Quality Epitaxial YBCO Films On Si", IEEE Trans. on Applied Superconductivity, vol. 1(1), pp. 67–73 (Mar. 1991).

D.B. Fenner, D.K. Fork, G.A.N. Connell, J.B. Boyce, A.M. Viano, and T.H. Geballe, "High Critical Currents In Y–Ba–Cu–O Films On Silicon Using YSZ Buffer Layers", invited talk, Applied Superconductivity Conference, Snowmass CO, Sep. 1990, IEEE Trans. on Magnetics, vol. 27(2), pp. 958–965 (Mar. 1991).

\* cited by examiner

INTERFACE CONTROL FOR FILM DEPOSITION BY GAS-CLUSTER ION-BEAM PROCESSING

STATEMENT OF GOVERNMENT INTEREST

This invention was made partially with U.S. Government support from the U.S. Dept. of Commerce under a NIST-ATP "Cooperative Agreement" #70NANB8H4011 and partially with support from U.S. Dept. of Defense, BMDO, under a SBIR contract #DSWA01-98-M-0241. The U.S. Government has certain rights in the invention.

BACKGROUND OF THE INVENTION

This invention relates generally to the formation of thin films, and, more particularly to the formation of thin dielectric films by gas-cluster ion-beam (GCIB) on surfaces rendered free of native oxides to assure high quality interfacial layers and films.

The use of a GCIB for etching, cleaning, and smoothing of the surfaces of various materials is known in the art (See for example, U.S. Pat. No. 5,814,194, Deguchi, et al., "Substrate Surface Treatment Method", 1998). Means for creation of and acceleration of such GCIBs are also described in the Deguchi reference. It is also known (U.S. Pat. No. 5,459,326, Yamada, "Method for Surface Treatment with Extra-Low-Speed Ion Beam", 1995) that atoms in a cluster ion are not individually energetic enough (on the order of a few electron volts) to significantly penetrate a surface to cause the residual sub-surface damage typically associated with the other types of ion beam processing in which individual ions may have energies on the order of thousands of electron volts. Nevertheless, the cluster ions themselves can be made sufficiently energetic (some thousands of electron volts), to effectively etch, smooth or clean surfaces as shown by Yamada & Matsuo (in "Cluster ion beam processing", *Matl. Science in Semiconductor Processing I*, (1998) pp 27–41).

The heart of high-density memory and microprocessor chips is a very thin film of an electrically insulating material formed on the surface of a silicon crystal wafer. This insulator, referred to as the gate dielectric, must sustain very high electric fields and serve efficiently as the key component in the storage of electrical charge. A conductor film, not necessarily a true metal, must then be formed on top of the dielectric. Two basic types of microelectronic devices are fabricated from these so-called metal/insulator/silicon (MIS) layered structures, namely bit storage or "memory", and logic transistors. An assembly of many bit-storage units on a single silicon wafer is used to fabricate dynamic random-access memory (DRAM) integrated circuits, while an assembly of many logic transistors is used to fabricate microprocessors. As the chip industry moves toward smaller circuit elements packed more tightly on the chip, it is required that the area devoted to each charge-storage circuit on the chip be not only smaller but also store at least the same amount of charge. Two approaches are possible, first the thickness of the gate dielectric film can be reduced and second the intrinsic storage ability of that insulator, called its dielectric constant, can be increased by choice of a new kind of material. Up until the present time, the chip industry has used silicon oxide (nominally $SiO_2$, referred to as silica or just "oxide") as the dielectric and has succeeded in making each chip generation with thinner oxide films. When the insulator is this oxide, then the structures consisting of a conductor (metal or polysilicon) film, on an oxide film, in turn on silicon, is the metal/oxide/silicon (MOS) structure employed as the basic building block unit of the vast majority of the semiconductor industry product. But the trend of continuing to reduce the thickness of the oxide film in the MOS is projected to run out of potential as it reaches basic physical limits.

Silicon oxide thin films have been the basis for gate dielectrics in silicon-based very large scale integration (VLSI) complementary metal-oxide semiconductors (CMOS) for several decades now. As the industry moves toward more advanced devices, the gate dielectric thickness is reduced with each design generation but will soon reach what is believed to be an ultimate limit. When the physical thickness of any dielectric material is less than about 5 to 15 Å, direct quantum tunneling across this dielectric barrier results in sufficient current (leakage) as to cause the CMOS transistors to malfunction. CMOS now being developed for production manufacture and marketing in the near future, will utilize oxide films at about this critical thickness. Thinner films of oxide cannot be used in future generations of CMOS technology, no matter what their composition or state of matter. The physical thickness of the film must be kept greater than this approximate amount.

Research into new materials has suggested that a compound known as silicon nitride (nominally $Si_3N_4$) may be used for a gate dielectric with a higher dielectric constant. In a CMOS structure when the dielectric is other than silicon oxide, the layer stack of gate/dielectric/silicon is referred to as metal/insulator/silicon or MIS. The dielectric constant ($\kappa$) for $Si_3N_4$ is about 4.2 compared with about 2.13 for $SiO_2$, at low frequencies. Considerable effort has already been expended on developing apparatus and methods to fabricate thin silicon nitride films. While material quality has improved, it appears that heretofore it has not been possible to avoid having the quality of this material compromised by either poor atomic structure, unsatisfactory stoichiometry (ratio of number of silicon atoms to those of nitrogen), or unwanted impurities such as oxygen or hydrogen. This has delayed the introduction of such films and now it is less clear that the modest increase in physical thickness will result in the necessary advantage for CMOS device performance in future generations.

Metal-oxide compounds of many kinds, mainly those utilizing transition metals, have potentially useful dielectric properties as well as compatibility with silicon wafers and the fabrication processes required to construct VLSI CMOS devices. There are a wide variety of materials being evaluated at present for this application, which can be grouped according to the approximate magnitude of their dielectric constant. So-called medium-$\kappa$ materials include: $Ta_2O_5$, $CeO_2$, $TiO_2$, $ZrO_2$, $HfO_2$, and $(Al,Zr)O_2$. $(Al,Zr)O_2$ can be formed with many ratios of Al to Zr content (as in a metal alloy). For these, the $\kappa$ ranges from ~10 to 50, with 28 for $ZrO_2$ and $HfO_2$ being typical. These latter are known to provide films that at physical thickness of 50 Å function in thin-film MIS capacitors with effective (oxide-like) thickness of about 10 Å. Other metal-oxide compounds are dielectrics with much larger $\kappa$, the so-called high-$\kappa$ materials. Among these $BaTiO_3$, $SrTiO_3$, $PbTiO_3$, $ZrTiO_3$ and the alloys $(Ba,Sr)TiO_3$ and $(Pb,Zr)TiO_3$ are known to have $\kappa$ in excess of 100 and in single crystals in excess of 1000. Film deposition and processing difficulties presently limit the introduction of these dielectrics into CMOS technology.

Oxide dielectric films on silicon of the best quality are grown at elevated temperature by reaction of environmental oxygen or oxygen-containing gasses with the silicon surface, i.e., so-called thermal oxidation. All of the dielectrics with larger $\kappa$ must be deposited and this introduces several difficulties. One of these difficulties is that the metal-oxide compounds that compose these dielectrics will themselves react with the silicon forming a compound of metal, silicon, and oxygen in a thin layer at the interface (H. Ono and K.-I. Koyanagi in "Formation of Silicon-Oxide Layers at the Interface Between Tantalum Oxide and Silicon Substrate", *Applied Physics Letters*, Vol. 75, pp. 3521–3523 (1999)). These interfacial layers often are poor quality dielectrics with either reduced κ, are somewhat conducting or have a high density of charge trapping sites. Also, any appreciable thickness of this layer will then reduce the overall effective dielectric effect of the capacitor in the CMOS device and hence the deposited film must be reduced in thickness to achieve the required capacitance, and this in turn counters the intent of using the higher-κ film material.

One nearly ideal construction for metal-oxide dielectric films on silicon is to have a single atomic layer (i.e., a monolayer) of some suitable element terminating the silicon at the interface. Hydrogen and nitrogen are two known suitable elements for silicon termination. Silicon wafers, prior to coverage with a film, are known to be extremely reactive with oxygen containing gasses, even in trace amounts. This reaction forms a very thin oxide film, often called a native oxide on the silicon surface, but it is of poor dielectric quality. Methods are known to use aqueous solutions with HF that etch off oxides from silicon and leave behind a monolayer of hydrogen, so-called hydrogen termination (H-termination) of the surface. Connell et al (U.S. Pat. No. 5,173,474, Silicon Substrate Having an Epitaxial Superconducting Layer Thereon and Method of Making Same, (1992)) have described such a method that can be incorporated into the process for thin film deposition by the methods of physical-vapor deposition (PVD) including pulsed-laser deposition (PLD). Heating the silicon wafer to well above 400° C. in the deposition system just prior to initiation of the flux of material to be deposited, causes the hydrogen to desorb from the silicon and to move into the chamber vacuum. Thus, hydrogen is not present on the surface during the film deposition, and consequently, upon completion of the deposition, no hydrogen remains as an interfacial layer. Yttria-stabilized zirconia (YSZ) films deposited by this method were found to form dielectrics useful in MIS capacitors (see E. Ajimine, et al. in "Electrical Characterization of Metal-Insulator Semiconductor Diodes Fabricated from Laser-Ablated $YBa_2Cu_3O_{7-\delta}$/Yttria-Stabilized Zirconia Films on Si Substrates", *Applied Physics Letters*, Vol. 59, pp. 2889–2891 (1991); and J. Qiao, et al. in "Thermally Activated Reversible Threshold Shifts in $YBa_2Cu_3O_{7-\delta}$/Yttria-Stabilized Zirconia/Si Capacitors", *Applied Physics Letters*, Vol. 61, pp. 3184–3186 (1992); and J. Qiao, et al. in "Determination of the Density of Trap States at $Y_2O_3$-Stabilized $ZrO_2$/Si Interface of $YBa_2Cu_3O_{7-\delta}$/$Y_2O_3$-Stabilized $ZrO_2$/Si Capacitors", *Applied Physics Letters*, Vol. 64, pp. 1732–1734 (1994)).

It is known that nitrogen annealing has an improving effect on the dielectric quality of many types of grown oxide dielectrics on silicon (see H. Yang and G. Lucovsky, "Integration of Ultrathin (1.6~2.0 nm) RPECVD Oxynitride Gate Dielectrics into Dual Poly-Si Gate Submicron CMOSFETs" *IEDM Technical Digest*, pp. 245–248 (IEEE, 1999)). Nitridation of the silicon surface prior to growth by exposure to NO or $NH_3$ gas results in a very thin interfacial layer after deposition of metal-oxide dielectric films (see H. F. Luan, et al., "High Quality $Ta_2O_5$ Gate Dielectrics with $T_{ox,eq}<10$ Å", *IEDM Technical Digest*, pp. 141–144 (IEEE, 1999)). The nitrogen-termination layer reduces the charge-trapping defects and acts as a diffusion barrier to prevent the oxygen of the overlying metal-oxide film from migrating down to the silicon where it would otherwise form a silicon oxide.

Methods of hydrogen termination of silicon that render improved interfaces with subsequently deposited thin, metal films have been described by I. Kondo et al. (in "Effects of Different Pretreatments on the Surface Structure of Silicon and the Adhesion of Metal Films", *Journal of Vacuum Science and Technology*, Vol. A10, p. 3166–3170 (1992); in "Interface Structure and Adhesion of Sputtered Metal Films on Silicon: The Influence of Si Surface Condition", *Journal of Vacuum Science and Technology*, Vol. A11, p. 319–324 (1993)); by B. G. Demczyk et al. (in "Growth of Cu Films on Hydrogen Terminated Si(100) and Si(111) Surfaces", *Journal of Applied Physics*, Vol. 75, p. 1956–1961 (1994)); by E. T. Krastev et al. (in "Surface Morphology and Electric Conductivity of Epitaxial Cu(100) Films Grown on H-Terminated Si(100)", *Journal of Applied Physics*, Vol. 79, p. 6865–6871 (1996) ); and by H. Gong et al (in "Highly Oriented NiFe Soft Magnetic Films on Si Substrates", *Journal of Applied Physics*, Vol. 85, p. 5750–5752 (1999)).

It is highly desirable to effectively form thin dielectric films which overcome the past problems associated with such thin film deposition.

It is therefore an object of this invention to provide improved methods for deposition of an improved thin dielectric film on silicon wafers.

It is a further object of this invention to improve control of the interface and interfacial layer between a semiconductor and a thin dielectric film on the semiconductor.

SUMMARY OF THE INVENTION

The objects set forth above as well as further and other objects and advantages of the present invention are achieved by the various embodiments of the invention described hereinbelow. Methods are disclosed for gas-cluster ion-beam deposition of thin films on silicon wafers rendered free of native oxides by termination of the surface bonds. The present invention controls the interface between deposited thin films and monocrystalline silicon, which is critical to the film properties, and hence enhances the usefulness of such films in microelectronic and photonic applications. Hydrogen termination of the surface of silicon renders it inert to reoxidation from oxygen-containing environmental gasses, even those found as residue in vacuum systems, such as those used to deposit films. Nitrogen termination improves the interface with overlying metal-oxide thin films. The present invention describes both ex-situ and in-situ methods for termination.

Upon initiation of the film-deposition flux, much of the hydrogen is displaced from the surface and the film is formed in intimate contact with the silicon crystal surface forming a nearly ideal interface. Ion beams composed of nanoparticles or clusters of condensed gasses may be used to deposit thin films with advantages derived from the nanoparticle impact energy but without the known effects of ion mixing, implantation and roughening which occur with atomic and molecular ion-beam deposition. Advantages of this combination of deposition and initial substrate surface processing are described in detail hereinbelow. In particular, this invention is especially effective for, but not limited to, formation of metal-oxide compounds such as $Ta_2O_5$, $CeO_2$, $HfO_2$, $TiO_2$, $ZrO_2$ and $Al_xZr_{1-x}O_2$ with higher dielectric constant than silicon dioxide films.

For a better understanding of the present invention, together with other and further objects thereof, reference is made to the accompanying drawings and detailed description and its scope will be pointed out in the appended claims.

DETAILED DESCRIPTION OF THE PREFERRED EMBODIMENTS

Figure 1:
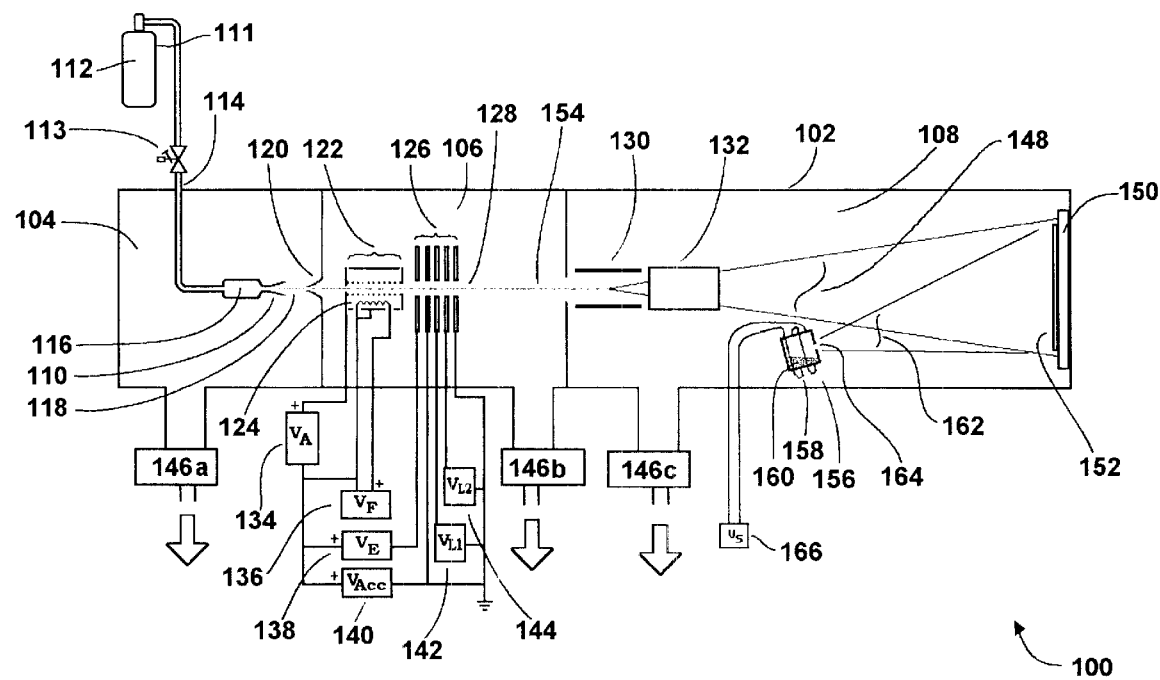
FIG. 1 is a schematic showing the basic elements of a prior art GCIB processing system.

FIG. 1 shows a typical configuration for a GCIB processing system 100 of a form known in prior art, which has capability to perform GCIB processing including GCIB assisted deposition, and which may be described as follows: a vacuum vessel 102 is divided into three communicating chambers, a source chamber 104, an ionization/acceleration chamber 106, and a processing chamber 108,. The three chambers are evacuated to suitable operating pressures by vacuum pumping systems 146a, 146b, and 146c, respectively. A condensable source gas 112 (for example an inert gas such as argon or a reactive gas such as $N_2$) stored in a cylinder 111 is admitted under pressure through gas metering valve 113 and gas feed tube 114 into stagnation chamber 116 and is ejected into the substantially lower pressure vacuum through a properly shaped nozzle 110. A supersonic gas jet 118 results. Cooling, which results from the expansion in the jet, causes a portion of the gas jet 118 to condense into clusters, each consisting of from several to several thousand weakly bound atoms or molecules. A gas skimmer aperture 120 partially separates the gas molecules that have not condensed into a cluster jet from the cluster jet so as to minimize pressure in the downstream regions where such higher pressures would be detrimental (e.g., ionizer 122, high voltage electrodes 126, and process chamber 108). Suitable condensable source gases 112 include, but are not necessarily limited to argon, nitrogen, carbon dioxide, oxygen, and other gases.

After the supersonic gas jet 118 containing gas clusters has been formed, the clusters are ionized in an ionizer 122. The ionizer 122 is typically an electron impact ionizer that produces thermoelectrons from one or more incandescent filaments 124 and accelerates and directs the electrons causing them to collide with the gas clusters in the gas jet 118, where the jet passes through the ionizer 122. The electron impact ejects electrons from the clusters, causing a portion the clusters to become positively ionized. A set of suitably biased high voltage electrodes 126 extracts the cluster ions from the ionizer, forming a beam, then accelerates them to a desired energy (typically from 1 keV to several tens of keV) and focuses them to form a GCIB 128 having an initial trajectory 154. Filament power supply 136 provides voltage V, to heat the ionizer filament 124. Anode power supply 134 provides voltage $V_A$ to accelerate thermoelectrons emitted from filament 124 to cause them to bombard the cluster containing gas jet 118 to produce ions. Extraction power supply 138 provides voltage $V_E$ to bias a high voltage electrode to extract ions from the ionizing region of ionizer 122 and to form a GCIB 128. Accelerator power supply 140 provides voltage $V_{Acc}$ to bias a high voltage electrode with respect to the ionizer 122 so as to result in a total GCIB acceleration energy equal to $V_{Acc}$ electron volts (eV). One or more lens power supplies (142 and 144 shown for example) may be provided to bias high voltage electrodes with potentials ($V_{L1}$ and $V_{L2}$ for example) to focus the GCIB 128. Two pairs of orthogonally oriented electrostatic scan plates 130 and 132 can be utilized to produce a raster or other scanning pattern across the desired processing area. When beam scanning is performed, the GCIB 128 is converted into a scanned GCIB 148, for scanning the entire surface of workpiece 152.

An evaporation oven 156 has an electrical heating coil 158 that receives electrical power from oven power supply 166, which is adjustable so as to permit operation of the evaporation oven 156 over a range of selectable temperatures ranging from room temperature to several hundreds of ° C. The evaporation oven 156 is filled with a charge 160 of vaporizable feed material that is to be vapor deposited on workpiece 152. Deposition vapor plume 162 is produced by evaporation oven 156. The evaporation oven is disposed so that the deposition vapor plume 162 is directed toward workpiece 152.

The workpiece 152, which may be a semiconductor wafer or other workpiece to be processed by GCIB processing, is held on a workpiece holder 150, disposed in the path of the GCIB 148 and deposition vapor plume 162. For GCIB processing without deposition, the workpiece 152 is irradiated only by scanned GCIB 148. For GCIB assisted deposition, the workpiece 152 is irradiated by both scanned GCIB 148 and deposition vapor plume 162.

Figure 2A:
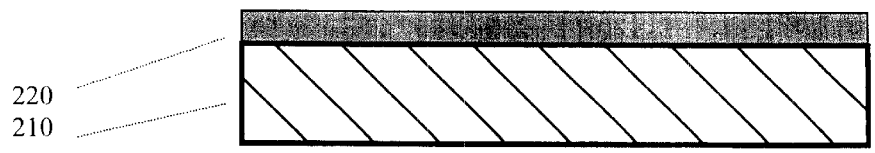
FIGS. 2A through 2D are a sequence showing a prior art method for deposition of thin oxide films by use of a gas-cluster ion beam.
Figure 2B:
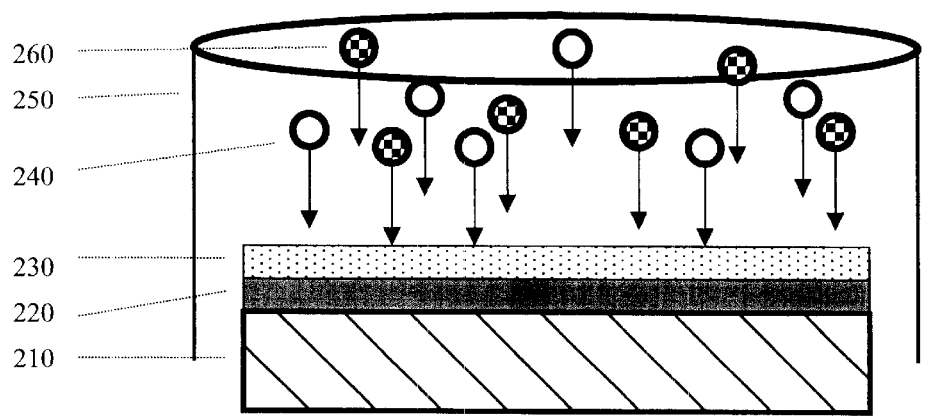
Figure 2C:
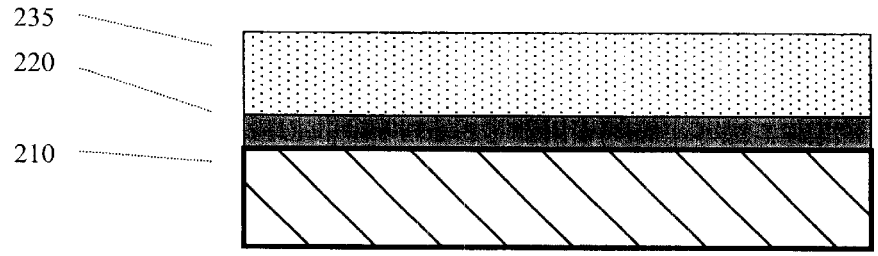
Figure 2D:
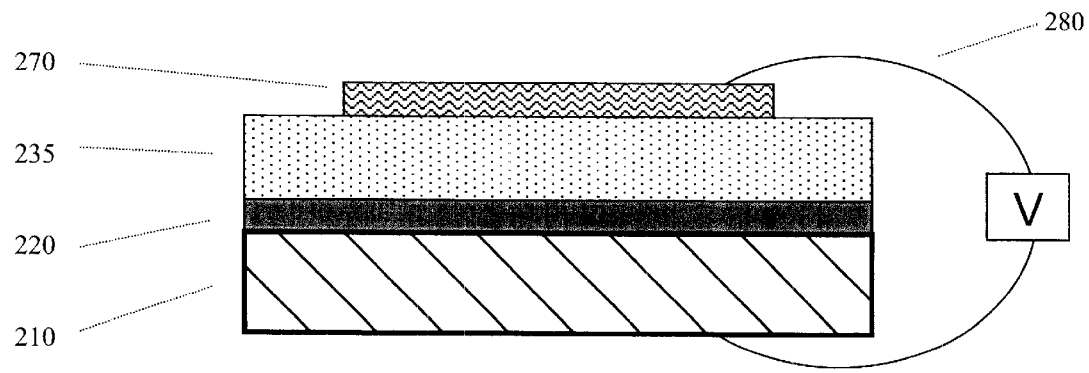

The prior art for GCIB deposition of thin oxide films is illustrated as a sequence of steps in FIGS. 2A through 2D The FIG. 2A shows the cross-section of a substrate, for example a silicon wafer 210 with a native oxide 220 on the wafer. In FIG. 2B, the cluster-ion processing is shown as a processing chamber 250 of a complete GCIB processing system (not shown) that bombards the wafer 210 and native oxide film 220. The bombarding materials are the clusters 240 and these cause a film 230 to form on the substrate surface. That formation or deposition may occur by chemical reaction of the gas-cluster material with the substrate surface, or a reaction of the cluster-gas material with any other source of beam material 260, such as evaporated or sputtered metal. In FIG. 2C, the formed film 235 is complete and is now thicker than 230. Finally, FIG. 2D shows use of the film 235 on the substrate wherein, by known methods, a metal or conducting film 270 is fabricated on top. An external electrical circuit 280 including wires and a voltmeter (V) serve to form a parallel-plate capacitor (210, 220, 235, and 270) and charging apparatus (280), according to known art.

Figure 3A:
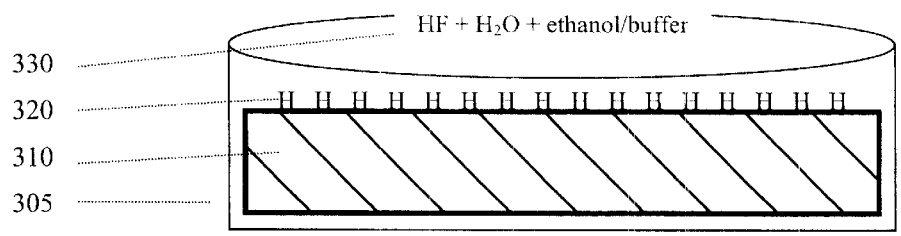
FIGS. 3A through 3D are a sequence showing thin film formation according to an embodiment of the invention.

FIGS. 3A through 3D shows a first sequence of steps for thin film formation according to a first method of this invention. In FIG. 3A, a silicon wafer substrate 310 is shown immersed in a wet-solution chemistry 330 made up of HF, water and ethanol or like, and contained in a wet processing vat 305. This results in the etching away of the native oxide and replacement by a monolayer of hydrogen 320, thus hydrogen termination of the silicon surface, in a conventional way.

Solutions of hydrofluoric acid (HF) in water are known to be useful for etching oxide films from silicon wafers since the etch rate of silicon in this type of solution is extremely slow. It is known that if the wafer is essentially free of contamination (typically by virtue of a previous cleaning procedure) and the wafer is not further exposed to other solutions such as a water washing or flushing, then the surface of the silicon after the HF etch is extremely stable against reoxidation as a consequence of a monolayer of hydrogen at the surface. The hydrogen begins to desorb from that surface upon heating to about 400° C. or upon deposition of a film onto that surface. In the latter case, the impact of the deposition substance and associated knock-off collisions or chemical exchange reactions will remove the hydrogen from the interface.

According to this first method of the present invention, silicon wafer substrates are first cleaned by aggressive agents in wet acid/base solutions and then treated with an HF solution. The preferred wet cleaning is accomplished by the known "RCA" method (first reported at RCA Laboratories) whereby a sequence of solutions is applied to the wafer, such as: SC1, piranha, S2 and water. Here the SC1 is an aqueous solution of $NH_4OH$ and $H_2O_2$ heated to about 70° C. The SC2 is an aqueous solution of HCl and $H_2O_2$ also heated to about 70° C. The piranha is an acid etch solution consisting of $H_2SO_4$ and $H_2O_2$ which may be heated to as much as 100 or 150° C. Many variations on this basic sequence are known in the art, and many of these methods are suitable for application in the present invention. The choice depends primarily on the extent and type of contamination initially on the wafer.

Next this clean silicon wafer substrate is immersed in an HF solution for etching and H-termination. The solution may be simply HF and water, in proportions of about 1% up to 10% concentrated HF, or with additional ingredients. Additions of ethanol or methanol (replacing most or all of the water) are helpful for improving the wetting of silicon, especially after the oxide is removed, and additions of $NH_4F$ (typically 7 parts 40% $NH_4F$ in 1 part concentrated HF) are useful for buffering the solution pH. Immersion time required to remove all the native oxide on silicon depends on the thickness of that oxide. This is typically 3 to 5 nm and hence 10 to 15 sec immersion is sufficient. It is preferred to apply the HF solution by dispensing it onto the silicon wafer substrate from a pipette, or the like, while the wafer is rapidly rotating in a wafer spinner, since the spinning action serves well to dry the wafer surface after a few seconds on immersion in the solution. It is important not to wash this etched surface with any liquid such as water or to expose it to heat, since at this point in the process the surface has the hydrogen monolayer.

This H-terminated silicon wafer substrate 310 is next mounted in a GCIB processing chamber 370 of a GCIB processing system having workpiece heating means capable of heating the silicon wafer substrate 310. Such a GCIB processing system is described hereinbelow. The processing chamber 370 is evacuated to a pressure of $10^{-7}$ millibar or less. The silicon wafer substrate 310 is heated to about 200 to 300° C., in the vacuum, for a few minutes at this point to desorb any water that is adsorbed on the substrate surface. In this temperature range the hydrogen is not removed. As the desorbsion process nears completion, it is preferable that the pressure in the GCIB processing chamber be decreased, and pressure in the range of $10^{-8}$ to $10^{-9}$ millibar is preferred.

Figure 3B:
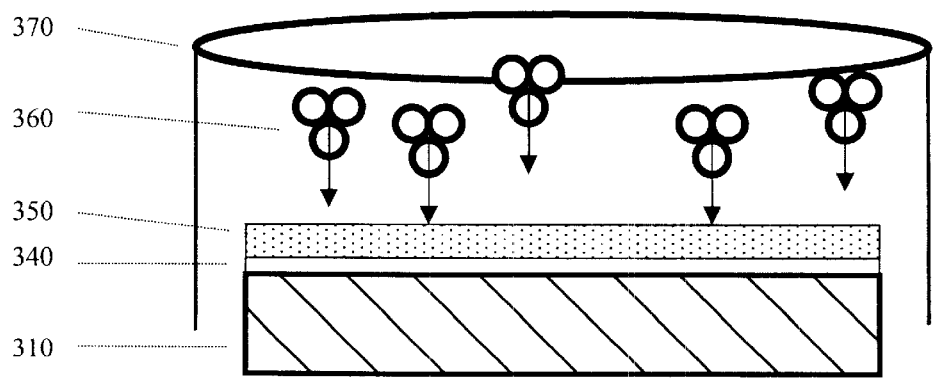
Figure 3C:
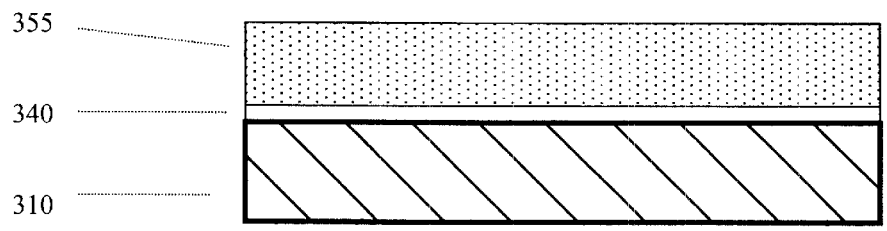
Figure 3D:
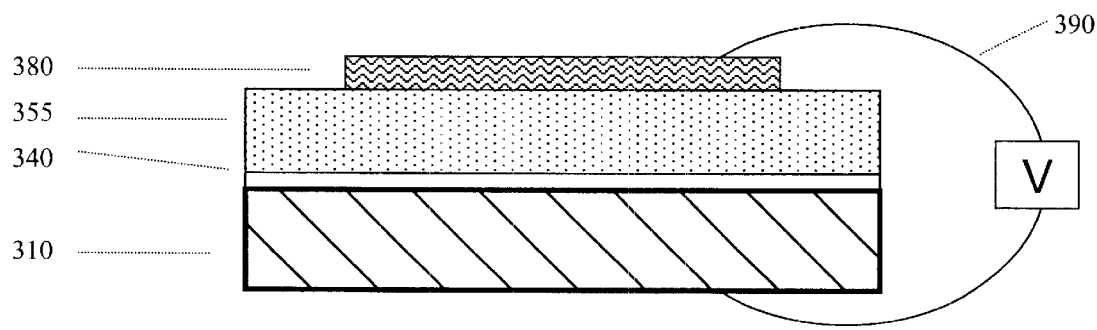

Next the H-terminated silicon wafer substrate 310 is bombarded by gas-cluster ions 360 of a species that is reactive with the silicon, nitrogen for example. The gas-cluster ion bombardment removes the hydrogen that has previously terminated the silicon wafer substrate's surface and forms a film, silicon nitride, for example. FIG. 3B shows the previously H-terminated silicon wafer substrate 310 being bombarded by gas-cluster ions 360 with a GCIB apparatus 370, thereby removing the H and forming a film 350, silicon nitride for example, directly on the substrate. During the gas-cluster ion bombardment, the pressure is preferably $10^{-9}$ millibar or less so as to limit the exposure rate of the silicon surface to hydrogen, oxygen, and water vapor during deposition. An extremely thin, interfacial layer 340, which is substantially free of hydrogen, may be formed also. At the completion of the reactive gas-cluster ion bombardment, shown in FIG. 3C, the film 355 that has been formed is much thicker. Finally, FIG. 3D shows a metal layer 380 is fabricated by conventional methods onto the top surface of the film 355, and circuitry 390 is attached so that the construction functions as a parallel-plate capacitor.

According to a second method of this invention, silicon wafer substrates with native oxide are processed with a GCIB processing system having workpiece heating capability, and which system is operated in sequence with certain gases so as to have a collective effect of forming high quality, metal-oxide films on the silicon. First the silicon wafer substrate is cleaned and H-terminated with the known acid/base RCA methods, as described previously for the first method of this invention. Next the wafer is mounted into a GCIB process chamber, the chamber is evacuated and the substrate heated to desorb any water, again as described previously. The gas-cluster ion beam is initially directed onto the sample using argon gas and the exposure is limited to a brief period of time sufficient to etch away a thickness of $SiO_2$ corresponding to the estimated native-oxide thickness plus about a 10% overdose. The etch rate for the native oxide can be estimated by a series of timed and incremental argon-cluster doses to calibration films of $SiO_2$ grown in a high-temperature furnace on a silicon wafer. After dose, the films are then inspected with a measuring microscope of high resolution to determine the depth of the etch for each region where a known dose had been applied.

After GCIB removal of the native-oxide, the GCIB source gas is changed from argon to nitrogen and the wafer is exposed for a period of time sufficient to convert the surface to at least one monolayer of nitrogen (plus about a 10% overdose), thereby forming essentially a silicon nitride film. (The required exposure time can be estimated from calibrations by way of known dose increments to test samples followed by nitride film thickness measurement.) Then the GCIB source gas is changed again to argon and the surface is etched for the same brief period of time that was estimated to remove the native oxide. Subsequently the GCIB source gas is returned to nitrogen and the wafer exposed to at least one monolayer of nitrogen (plus about a 10% overdose). Additional repetitions of the argon and nitrogen GCIB sequence of exposures may be employed to remove any residual traces of oxygen at the silicon interface.

Figure 4A:
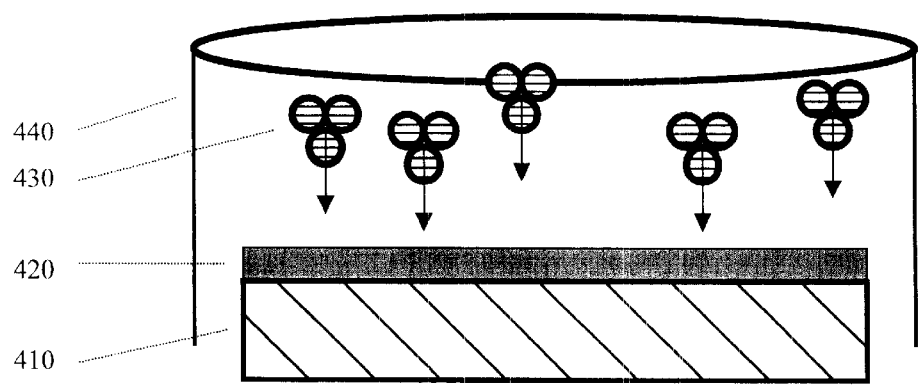
FIGS. 4A through 4D are a sequence showing thin film formation according to a second embodiment of the invention.
Figure 4B:
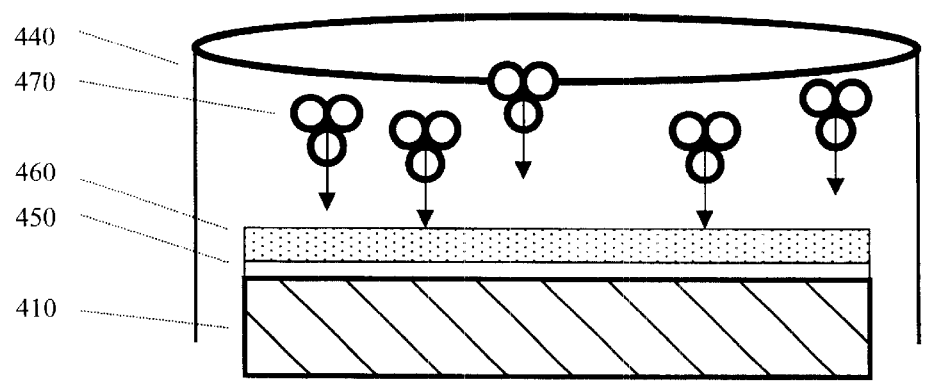
Figure 4C:
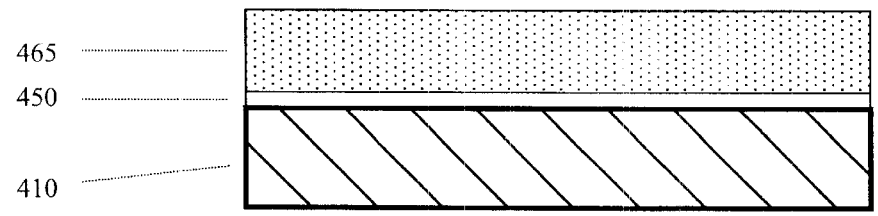
Figure 4D:
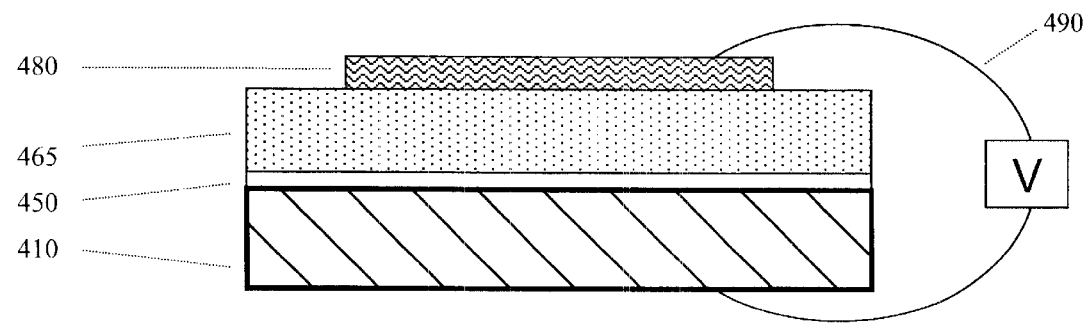

FIGS. 4A through 4D shows this second sequence of steps for thin film formation according to this invention. In FIG. 4A, the silicon wafer substrate 410 is shown with a native oxide film 420 undergoing bombardment by gas-cluster ions 430 within a conventional GCIB apparatus 440. Here the gas is selected to be such that it causes a chemical reaction with the native oxide film and in turn sputter etches that film away. After the native oxide has been entirely removed by this method, the gas forming clusters in conventional GCIB apparatus 440 is changed to a second species 470 shown in FIG. 4B that will react appropriately with the silicon wafer substrate 410. An extremely thin interfacial layer 450 may be formed. At the completion of the exposure to second species 470, shown in FIG. 4C, the film 465 that has been formed, is much thicker. Finally, FIG. 4D shows that a metal layer 480 is fabricated onto the top surface of the film 465, and circuitry 490 is attached so that the construction functions as a parallel-plate capacitor.

According to a third method of this invention, it is preferable that thin-film deposition, especially of metal-oxide compounds be preceded by deposition of approximately one monolayer of one of certain metals onto the H-terminated silicon. Metals known to function best for this purpose are those with a high oxygen affinity, including Zr, Hf, Mg, Ti and Y. A conventional evaporation oven source may be used or an electron-beam evaporator will serve for more rapid depositions. Deposition of this metal monolayer will be best at the lowest substrate temperature consistent with overall function, and ambient room temperature is preferred.

Following the formation of the metal interfacial layer, the gas-cluster ion beam (GCIB) is initiated and begins to bombard the sample simultaneously with the deposition of a metal from a thermal or an electron-beam evaporation source. That metal must now be the element or elements that are intended for the metal-oxide compound film that will serve as the dielectric layer on the silicon substrate. The GCIB is formed from oxygen gas or any condensable gas containing oxygen, such as NO, CO, $CO_2$ or $H_2O$. The beam is formed by ionization of the clusters, acceleration through a high voltage and incidence on the substrate at normal or near-normal angle. The acceleration voltage is chosen so that the cluster ion has an energy of a few to a few tens of electron volts, on average, per molecule contained in the cluster. Optionally the beam may be electrostatically scanned over the area of the substrate face to improve the uniformity of exposure.

It is preferred to provide a sufficient flux of oxygen relative to the flux of metal being deposited so that the metal is fully converted into the intended metal-oxide compound. A sufficient flux will be that which results in the intended atomic-stoichiometry ratio of oxygen to metal in the film compound. If the desired film is $ZrO_2$, then equal numbers of Zr atoms and $O_2$ molecules supplied from the gas phase and fully reacted at 100% efficiency will yield the desired compound. Also, the metal-oxide film may be deposited in multiple layers or in a graded fashion whereby the first layers, those nearest to the silicon substrate, are formed with less than the full flux of oxygen which can assist with preventing the formation of a silicon-oxide layer at the silicon interface. The graded flux of oxygen typically begins at 25 to 50% oxygen deficiency in the atomic ratio expected for the fully oxygenated film.

During the deposition of the metal-oxide film, the substrate may be heated. The choice of temperature is governed by the desired morphology of the deposited film, including the extent of or absence of crystallinity. Generally room temperature deposition results in amorphous films, higher temperatures will cause the formation of partially crystalline (polycrystalline) films and even higher temperatures in near single crystal and epitaxial films. Many of the metal-oxide compounds that are well suited for the next generations of CMOS gate dielectrics are expected to be amorphous, fully oxygenated and stoichiometric, and tolerant of brief heating to high temperatures. Oxygen stoichiometry of the film during deposition at lower substrate temperatures is improved by the use of oxygen-containing GCIB. Upon impact of the clusters with the deposition surface the kinetic energy of the nanoparticle cluster is converted into a very brief but very high temperature and pressure that serve to crack the oxygen or oxygen-containing molecules. This in turn renders the clusters highly effective in forming the metal-oxide compound intended, without the need for thermal energy from a heated substrate. In addition it is known in the art that low-energy ion impact during film deposition will result in a reduction of film stress and hence superior properties.

Figure 5A:
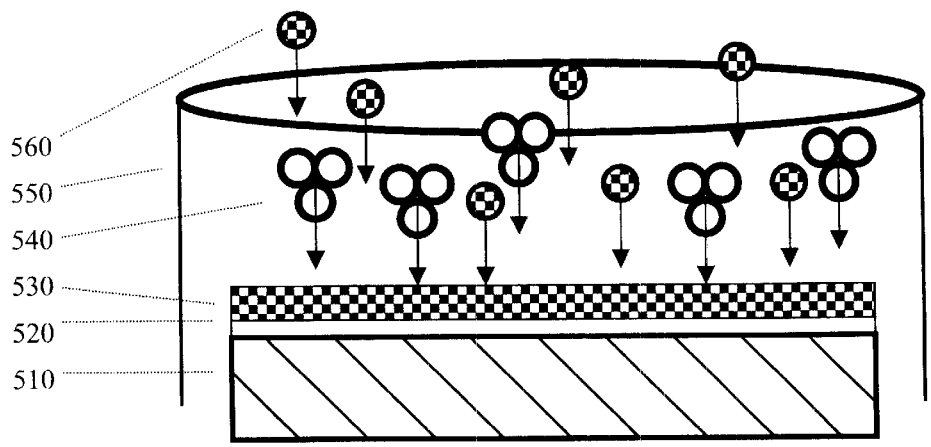
FIGS. 5A through 5C are a sequence showing thin film formation according to a third embodiment of the invention.
Figure 5B:
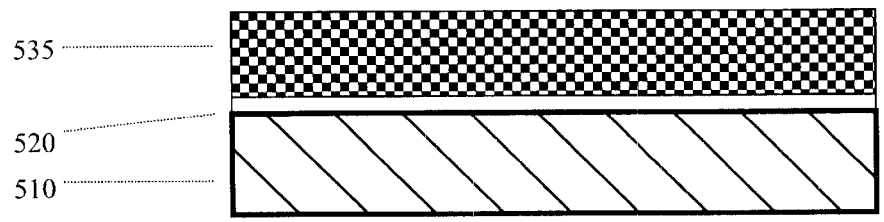
Figure 5C:
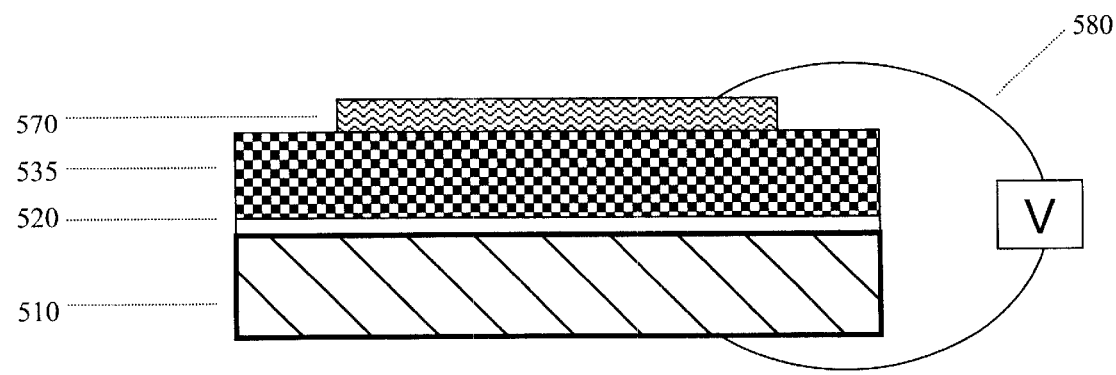

FIGS. 5A through 5C show a sequence of steps for thin film formation according to the third method of this invention. In FIG. 5A, the silicon wafer substrate 510 is shown after a native oxide film has already been removed according to the method illustrated in FIG. 4A. The gas forming clusters in the conventional GCIB apparatus 550 are a (gas cluster) species 540 that will react appropriately with the simultaneously deposited material 560 from another source, such as evaporated or sputtered metal, and form the thin-film layer 530. An extremely thin interfacial layer 520 may be formed.

Next a monolayer of at least one of the metals with a high oxygen affinity, including Zr, Hf, Mg, Ti and Y, is deposited onto the wafer surface. Finally, the GCIB source gas is changed to oxygen, or any condensable gas containing oxygen, and is bombarded onto the surface simultaneously with at least one metal from a thermal or electron-beam evaporation source. Beam scanning may be used and full oxidation must controlled, as described for the first method of this invention.

At the completion of the exposure, shown in FIG. 5B, the film 535 that has been formed, is much thicker. Again, the methods of this invention facilitate formation of a nitrogen interfacial layer on the silicon and a metal-oxide dielectric film deposited without reoxidation of the silicon interface.

Finally, as shown in FIG. 5C, a metal layer 570 is fabricated onto the top surface of the film 535, and circuitry 580 is attached so that the construction functions as a parallel-plate capacitor.

Figure 6:
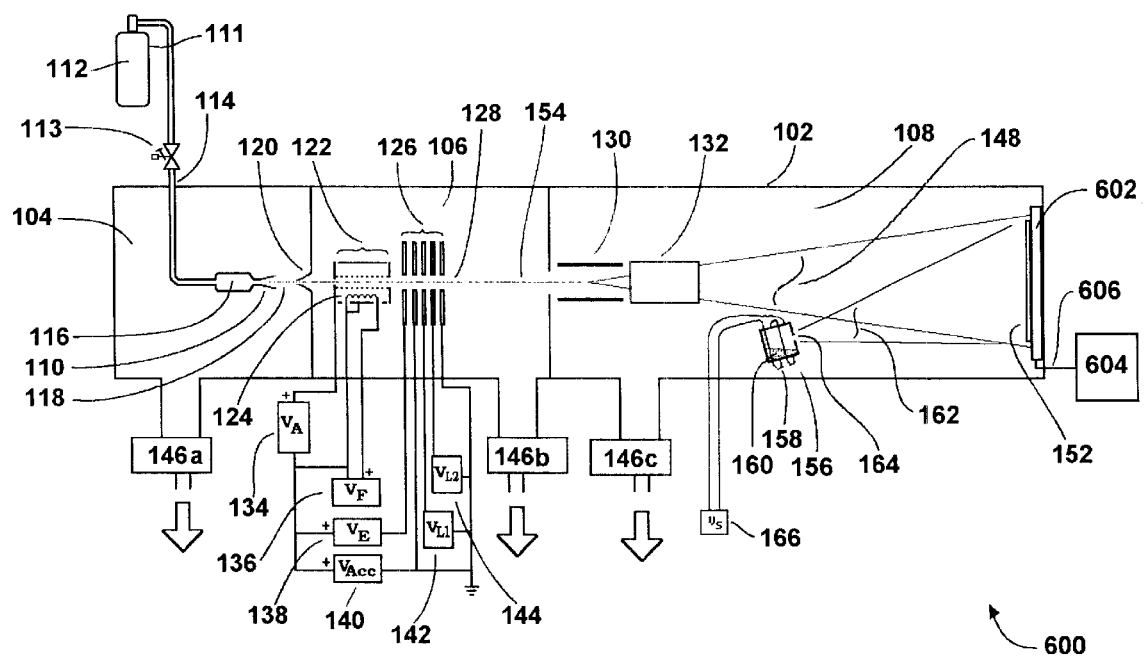
FIG. 6 is a schematic showing the basic elements of a GCIB processing system with workpiece heating means.

FIG. 6 shows a GCIB processing system 600 similar to the form known in prior art and shown in FIG. 1, but which has the improvement of the addition of means to heat the workpiece as is required for practicing some steps of the method of the present invention. Heated workpiece holder 602 has a resistive heating element (not shown) for heating the workpiece holder 602 and thereby heating the workpiece 152, which may be a silicon wafer substrate or such. An electrical cable 606 connects the resistive heating element of workpiece holder 602 to workpiece holder heating power supply 604. Workpiece holder heating power supply is adjustably operable to supply current for resistive heating of the workpiece holder 602. When power supply 604 is operated, the workpiece 152 and workpiece holder 602 are heated to a pre-adjusted temperature and when power supply 604 is not operated, the workpiece 152 is not heated by workpiece holder 602.

Although the invention has been described with respect to various embodiments, it should be realized this invention is also capable of a wide variety of further and other embodiments within the spirit and scope of the appended claims.

What is claimed is:

1. A method for film deposition on a semiconductor, comprising the steps of:
   removing oxide from a surface of die semiconductor;
   terminating the surface of the semiconductor with hydrogen;
   placing the semiconductor in a vacuum environment;
   desorbing volatile materials from the surface of the semiconductor by heating the semiconductor to a temperature of between approximately 200 and 400° C.;

subsequently bombarding the surface of the semiconductor with gas-cluster ions in order to remove said hydrogen; and forming a film on the surface of the semiconductor.

2. The method of claim 1, wherein said oxide is in the form of an oxide film.

3. The method of claim 2, wherein said oxide film is a native oxide film.

4. The method of claim 1, wherein said removing step is performed with an HF solution.

5. The method of claim 1, wherein said hydrogen termination step is performed with an HF solution.

6. The method of claim 1, wherein the semiconductor comprises a silicon wafer.

7. The method of claim 1, wherein the gas-cluster ions are reactive.

8. The method of claim 1, wherein the film formed on the surface of the semiconductor comprises a dielectric film.

9. The method of claim 1, further comprising the step of depositing a metal film on said film on the surface of the semiconductor to form an MIS capacitor.

10. A method for film deposition on a semiconductor, comprising the steps of:

placing the semiconductor in a vacuum environment;

desorbing volatile materials from a surface of the semiconductor by heating the semiconductor to a temperature of between approximately 200 and 400° C.;

subsequently removing oxide from the surface of the semiconductor by bombarding said oxide with gas-cluster ions;

terminating the surface of the semiconductor; and forming a film on the surface of the semiconductor.

11. The method of claim 10, wherein said gas-cluster ions are inert.

12. The method of claim 11, wherein said inert gas-cluster ions comprise argon gas-cluster ions.

13. The method of claim 10, wherein the semiconductor comprises a silicon wafer.

14. The method of claim 10, wherein said terminating step is performed by bombarding the surface of the semiconductor with gas-cluster ions.

15. The method of claim 14, wherein said gas-cluster ions comprise nitrogen gas-cluster ions.

16. The method of claim 10, wherein the step of forming said film on the surface of the semiconductor is performed by bombarding the surface of the semiconductor with gas-cluster ions.

17. The method of claim 16, wherein said gas-cluster ions comprise nitrogen gas-cluster ions.

18. The method of claim 11, wherein said terminating step is performed by bombarding the surface of the semiconductor with nitrogen gas-cluster ions.

19. The method of claim 18, wherein the steps of removing the oxide and terminating the surface are repeated at least one additional time.

20. The method of claim 10, further comprising the step of depositing a metal film on said film on the surface of the semiconductor to form an MIS capacitor.

21. The method of claim 19, further comprising the step of depositing a metal film on said film on the surface of the semiconductor to form an MIS capacitor.

22. The method of claim 10, wherein the film formed on the surface of the semiconductor comprises a dielectric film.

23. A method for film deposition on a semiconductor, comprising the steps of:

placing the semiconductor in a vacuum environment;

desorbing volatile materials from a surface of the semiconductor by heating the semiconductor to a temperature of between approximately 200 and 400° C.;

subsequently removing oxide from the surface of the semiconductor by bombarding said oxide with gas-cluster ions; and forming a film on the surface of the semiconductor.

24. The method of claim 23, wherein said gas-cluster ions are inert.

25. The method of claim 23, wherein the semiconductor comprises a silicon wafer.

26. The method of claim 23, wherein the step of forming said film on the surface of the semiconductor is performed by bombarding the surface of the semiconductor with gas-cluster ions while substantially simultaneously depositing a material.

27. The method of claim 26, wherein said material is selected from a group consisting of the elements Zr, Hf, Mg, Ti, and Y.

28. The method of claim 26, wherein said gas-cluster ions are reactive.

29. The method of claim 26, wherein said material is a vaporized metal.

30. The method of claim 23, further comprising the step of depositing a metal film on said film on the surface of the semiconductor to form an MIS capacitor.

31. The method of claim 23, wherein the film formed on the surface of the semiconductor comprises a dielectric film.

* * * * *